(12) United States Patent
Lin

(10) Patent No.: US 6,812,752 B2
(45) Date of Patent: Nov. 2, 2004

(54) EMBEDDED VOLTAGE LEVEL DETECTOR

(75) Inventor: Scott Lin, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/374,273

(22) Filed: Feb. 26, 2003

(65) Prior Publication Data
US 2003/0184265 A1 Oct. 2, 2003

(30) Foreign Application Priority Data
Mar. 28, 2002 (TW) ........................... 91203903 U

(51) Int. Cl.$^7$ ............................................. H03L 7/00
(52) U.S. Cl. ...................................................... 327/143
(58) Field of Search ............................... 327/142, 143, 327/198

(56) References Cited
U.S. PATENT DOCUMENTS
5,721,502 A * 2/1998 Thomson et al. ........... 327/143
6,310,497 B1 * 10/2001 Strauss ....................... 327/143

* cited by examiner

Primary Examiner—Jeffrey Zweizig
(74) Attorney, Agent, or Firm—Madson & Metcalf

(57) ABSTRACT

A voltage level detector for use between a power supply apparatus and a functional circuit is provided. The voltage level detector includes a power input terminal, a voltage dividing circuit and a logic operation circuit. The power input terminal is used for receiving power of a first voltage. The voltage dividing circuit is used for dividing the first voltage into a second voltage having a level lower than that of the first voltage but greater than a threshold voltage. The logic operation circuit is integrated with the functional circuit and having a first and a second input ends thereof electrically connected to the power input terminal and the voltage dividing circuit, respectively. According to the voltage level detector of the present invention, a warning signal is asserted to the functional circuit when the second voltage level drops below the threshold voltage.

20 Claims, 4 Drawing Sheets

EMBEDDED VOLTAGE LEVEL DETECTOR

FIELD OF THE INVENTION

The present invention relates to a voltage level detector, and more particularly to an embedded voltage level detector for use between a power supply apparatus and a functional circuit.

BACKGROUND OF THE INVENTION

A power supply apparatus is widely used to provide a working circuit with reliable power. The working circuit comprises many electronic devices, for example semiconductor memory devices or microprocessors, requiring a stable voltage. Therefore, the unstable voltage level of the supplied power will adversely affect the performance of the working circuit. Accordingly, a voltage level detector is provided between the power supply apparatus and the working circuit for detecting the voltage level of the supplied power. Then, measures will be taken when an unstable voltage is detected.

Referring to FIG. 1, a voltage level detector 12 is electrically connected with a power supply apparatus 10 and a working circuit 11. The conventional voltage level detector 12 comprises a voltage regulating circuit 121, a voltage comparing circuit 122 and a voltage dividing circuit 123. The voltage regulating circuit 121 receives and processes an input voltage V1 from the power supply apparatus 10 via a pin IN, and outputs a stable voltage Vout to the working circuit 11 via a pin OUT. The voltage dividing circuit 123 comprises a first resistor R1 and a second resistor R2, both electrically connected to the voltage comparing circuit 122. The resistors R1 and R2 are also electrically connected to a pin DIN and a ground pin GND, respectively, as shown in FIG. 1. A relatively stable reference voltage Vref is divided by the voltage dividing circuit 123 to result in a voltage V2 equal to $Vref \times R2/(R1+R2)$. The input voltage V1 is compared with the divided reference voltage V2 in the voltage comparing circuit 122. Once the input voltage V1 is lower than the voltage V2, it is determined that the power from the power supply apparatus 10 is unstable, and a warning signal will be asserted by the voltage level detector 12 via a pin DOUT to inform the working circuit 11.

Since the voltage level detector 12 as mentioned above is usually packaged as an independent integrated circuit (IC) chip, the cost related to package and test cannot be exempted from. In addition, such voltage level detector 12 comprises some analog circuits, which results in much power consumption.

SUMMARY OF THE INVENTION

It is an object of the present invention to provide a voltage level detector, which can be integrated into another IC chip so as to reduce the manufacturing and testing cost.

It is another object of the present invention to provide a voltage level detector, in which totally logic circuitry is employed to avoid large current passing therethrough, thereby minimizing power consumption.

In accordance with an aspect of the present invention, there is provided a voltage level detector for use between a power supply apparatus and a functional circuit. The voltage level detector comprises a power input terminal, a voltage dividing circuit and a logic operation circuit. The power input terminal is electrically connected to the power supply apparatus for receiving therefrom power of a first voltage. The voltage dividing circuit is electrically connected to the power input terminal for dividing the first voltage into a second voltage having a level lower than that of the first voltage but greater than a threshold voltage. The logic operation circuit is integrated with the functional circuit and having a first and a second input ends thereof electrically connected to the power input terminal and the voltage dividing circuit, respectively. According to the voltage level detector of the present invention, a warning signal is asserted to the functional circuit when the second voltage level drops below the threshold voltage.

In an embodiment, the logic operation circuit includes an AND gate.

In an embodiment, the voltage dividing circuit comprises a variable resistor for adjusting the second voltage.

In an embodiment, the voltage level detector of the present invention further comprises a sample and hold circuit. The sample and hold circuit is electrically and connected to the logic operation circuit for outputting the warning signal. Furthermore, the voltage level detector of the present invention comprises a refreshing circuit. The refreshing circuit is electrically connected to the sample and hold circuit for clearing an output of the sample and hold circuit.

In an embodiment, the voltage level detector of the present invention further comprises a ripple counter electrically connected to and disposed downstream of the logic operation circuit, and counting incrementally in response to the warning signal.

In an embodiment, the voltage level detector of the present invention further comprises a multiplexer electrically connected to the voltage dividing circuit, a reference voltage input terminal and the logic operation circuit, and selecting one of the second voltage and a reference voltage to be outputted in response to a selection signal. Furthermore, the voltage level detector of the present invention comprises a compensation resistor electrically connected among the multiplexer, the logic operation circuit and ground.

In an embodiment, the voltage level detector of the present invention further comprises a register electrically connected to the voltage dividing circuit for providing data to tune the second voltage.

In an embodiment, the voltage level detector of the present invention further comprises a resistor electrically connected between the power supply apparatus and the logic operation circuit for adjusting the second voltage.

In an embodiment, the voltage level detector is embedded in the integrated circuit having therein the functional circuit.

In an embodiment, the threshold value is a minimal input voltage value defined as a high level by the logic operation circuit. Alternatively, the threshold value is a maximal input voltage value defined as a low level by the logic operation circuit.

In accordance with another aspect of the present invention, there is provided a voltage level detector for use between a power supply apparatus and a functional circuit. The voltage level detector of the present invention comprises a power input terminal, a voltage dividing circuit and an AND gate. The power input terminal is electrically connected to the power supply apparatus for receiving therefrom power of a first voltage. The voltage dividing circuit is electrically connected to the power input terminal for dividing the the first voltage into a second voltage. The AND gate is integrated with the functional circuit and having a first and a second input ends thereof electrically connected to the power input terminal and the voltage dividing circuit, respectively, for receiving and operating the first and the second voltages according to a threshold value, thereby determining whether the power is in a stable state or not.

In an embodiment, the voltage level detector of the present invention further comprises a sample and hold circuit electrically connected to and AND gate for outputting a warning signal to the functional circuit when an output of the AND gate is pulled low.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
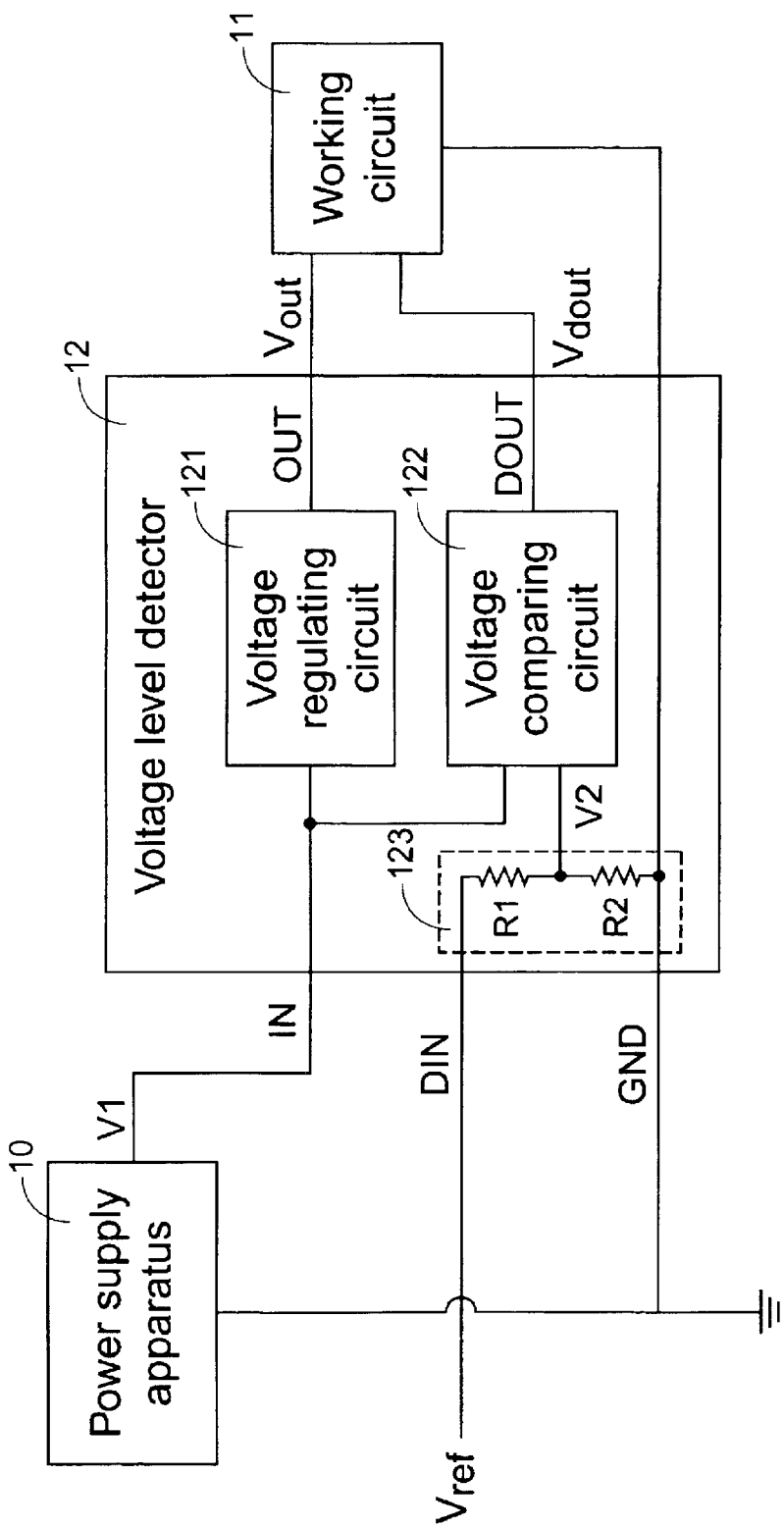
FIG. 1 is a functional block diagram illustrating a voltage level detector for use between a power supply apparatus and a working circuit according to prior art.
Figure 2:
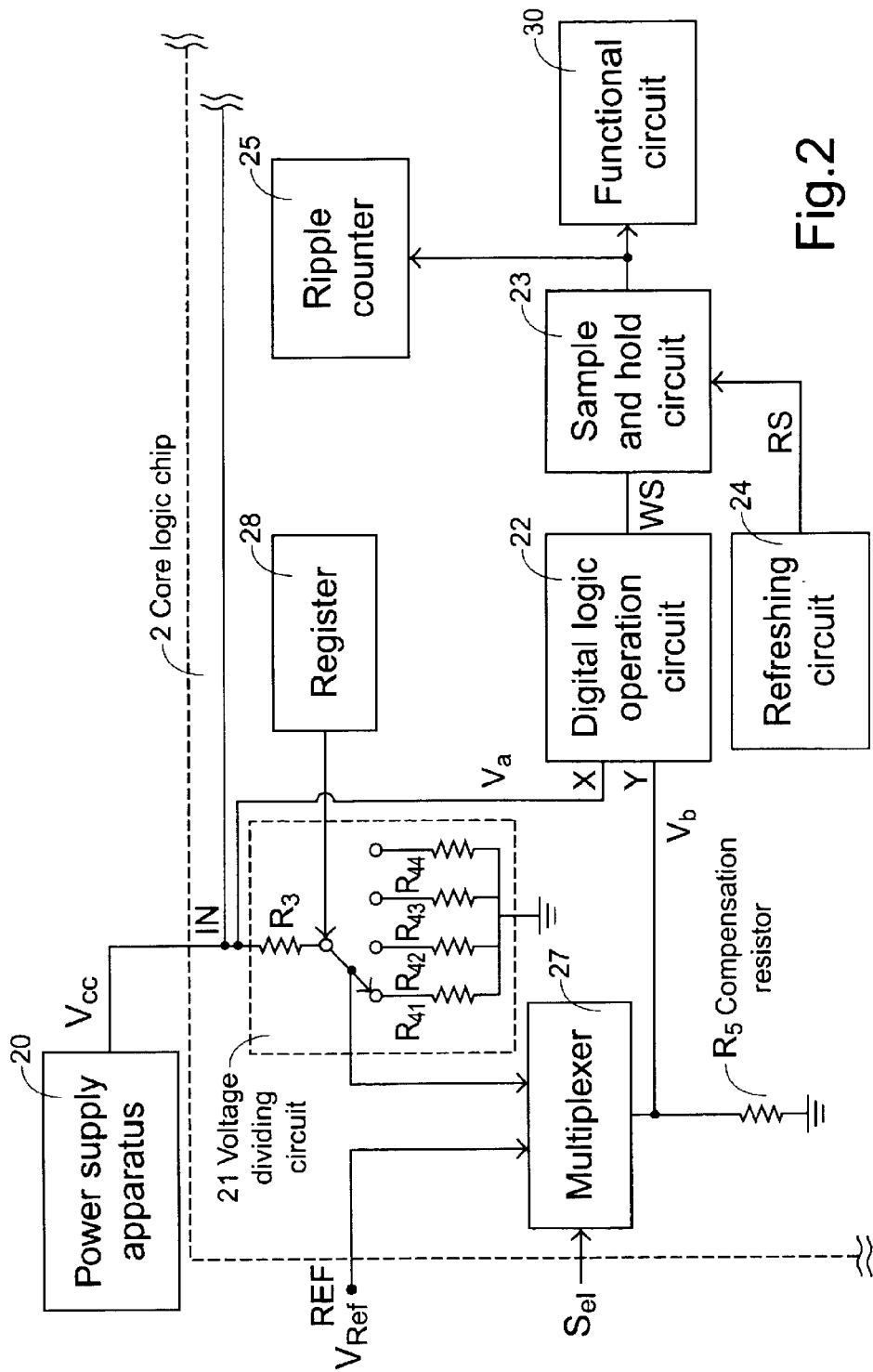
FIG. 2 is a functional block diagram illustrating a voltage level detector embedded in a core logic chip according to a preferred embodiment of the present invention.

Referring to FIG. 2, the voltage level detector according to a preferred embodiment of the present invention is provided between a power supply apparatus 20 and a functional circuit 30. The voltage level detector is integrally formed into a core logic chip 2 along with the functional circuit 30. The voltage level detector comprises a voltage dividing circuit 21, a digital logic operation circuit 22, a sample and hold circuit 23, a refreshing circuit 24, a ripple counter 25, a multiplexer 27 and a register 28.

The voltage level detector of the present invention has a power input terminal IN electrically connected to the power supply apparatus 20 for receiving therefrom power of an input voltage Vcc. The input power voltage Vcc is divided by the voltage dividing circuit 21 electrically connected to the power supply apparatus 20. The voltage dividing circuit 21 comprises a resistor R3 and a set of resistors R41, R42, R43 and R44 functioning as a variable resistor. By selecting a combination of the resistor R3 with one of the resistors R41, R42, R43 and R44, the input voltage Vcc is differently divided into an index voltage Vb. By means of the voltage dividing circuit 21, the index voltage Vb is lower than the input voltage Vcc.

The digital logic operation circuit 22 has two input ends X and Y for receiving the power input terminal IN and the outputs from a multiplexer 27, i.e. the original input voltage Va substantially equal to Vcc in this embodiment and the index voltage Vb, respectively. A minimal input voltage value that will be defined as a high level by the digital logic operation circuit 22 is referred as an upper threshold voltage VIH, and a maximal input voltage value that will be defined as a low level is referred as a lower threshold voltage VIL. The index voltage Vb is preferably just a little greater than the upper threshold voltage VIH after being divided by the voltage dividing circuit 21. For example, when Vcc=2.5 volts, and the upper threshold voltage VIH is set to be 2.0 volts, the index voltage Vb is preferably adjusted to 2.1 volts. Therefore, when the multiplexer 27 selecting the divided Vcc from the voltage dividing circuit 21 responsive of a signal Sel, if the input voltage Vcc from the power supply apparatus 20 has undesired variation, the index voltage Vb will correspondingly drop below the threshold voltage VIH, and thus a warning signal WS will be asserted by the digital logic operation circuit 22, and modified and outputted to the functional circuit 30 by the sample and hold circuit 23. For optional sensitivity, it is preferred that the warning signal WS is outputted only when the index voltage Vb becomes even lower than the lower threshold voltage VIL, as shown in FIG. 3(d).

The refreshing circuit 24 periodically asserts a refreshing signal RS to the sample and hold circuit 23 for periodically clearing an output of the sample and hold circuit 23. The ripple counter 25 counts incrementally in response to the warning signal WS so as to record times of unstable power input. The multiplexer 27 is electrically connected to the voltage dividing circuit 21, a reference voltage input terminal REF and the digital logic operation circuit 22. In response to the selection signal Sel, the multiplexer 27 will select one of the index voltage Vb and a reference voltage Vref to be outputted. The selection of the voltage-divided signal Vb outputted to the digital logic operation circuit 22 is followed by the voltage level detection procedure as mentioned above. The register 28 is electrically connected to the voltage dividing circuit 21 for storing and providing voltage-dividing related data to tune the divided Vcc as an input of the multiplexer 27, and thus to further tune the index voltage Vb when the divided Vcc is selected as the output of the multiplexer 27 by the signal Sel. Optionally, a compensation resistor R5 is electrically connected among the multiplexer 27, the digital logic operation circuit 22 and ground for adjusting the index voltage Vb.

Figure 3B:
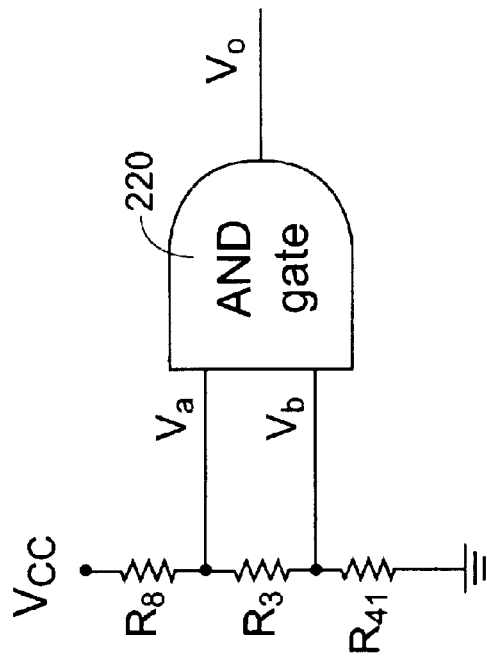
FIG. 3(b) schematically illustrates another example of the digital operation circuit and voltage dividing circuit of FIG. 2 and the cooperation thereof.
Figure 3A:
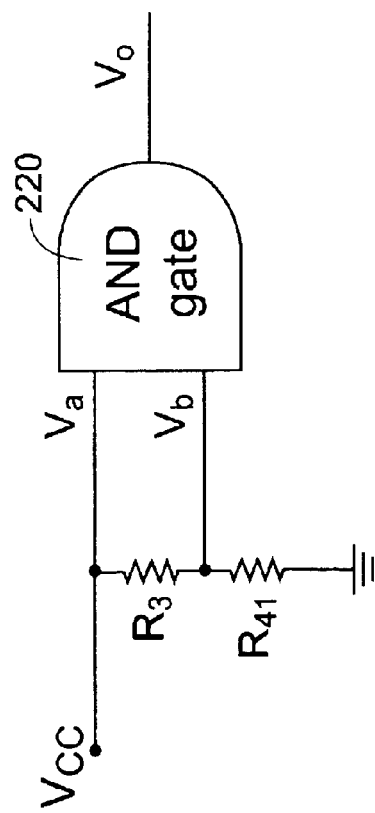
FIG. 3(a) schematically illustrates an example of the digital logic operation circuit and voltage dividing circuit of FIG. 2 and the cooperation thereof.

Please refer to the example shown in FIG. 3(a) wherein the digital logic operation circuit 22 is an AND gate 220, Va=Vcc, and the combination of the resistors R3 and R41 are used for adjusting the index voltage Vb, when the divided Vcc is selected as the output of the multiplexer 27 by the signal Sel. The index voltage Vb equals to Vcc×R41/(R3+R41). As mentioned above, the compensation resistor R5 is optionally provided. When the compensation resistor R5 is given, a more stable index voltage Vb will be obtained. The index voltage Vb becomes Vcc×R'/(R3+R'), in which R'=(R5×R41)/(R5+R41). For achieving desired bias and thus minimizing possible errors, an additional resistor R8 is preferably provided between Vcc and the input end X of the AND gate 220, as shown in FIG. 3(b). Under this circumstance, Va=Vcc×(R3+R41)/(R3+R41+R8), and Vb=Vcc×R41/(R3+R41+R8). In a more generalized instance, when the register 28 is set to select the resister R4$n$ ($n$=1, 2, 3, or 4) in the voltage dividing circuit 21, Va=Vcc×(R3+R4$n$)/(R3+R4$n$+R8), and Vb=Vcc×R4$n$/(R3+R4$n$+R8), wherein $n$=1, 2, 3, or 4. If R8 does not exist and thus is omitted Va=Vcc, and Vb=Vcc×R4$n$/(R3+R4$n$), wherein $n$=1, 2, 3, or 4.

Figures 3C, 3D:
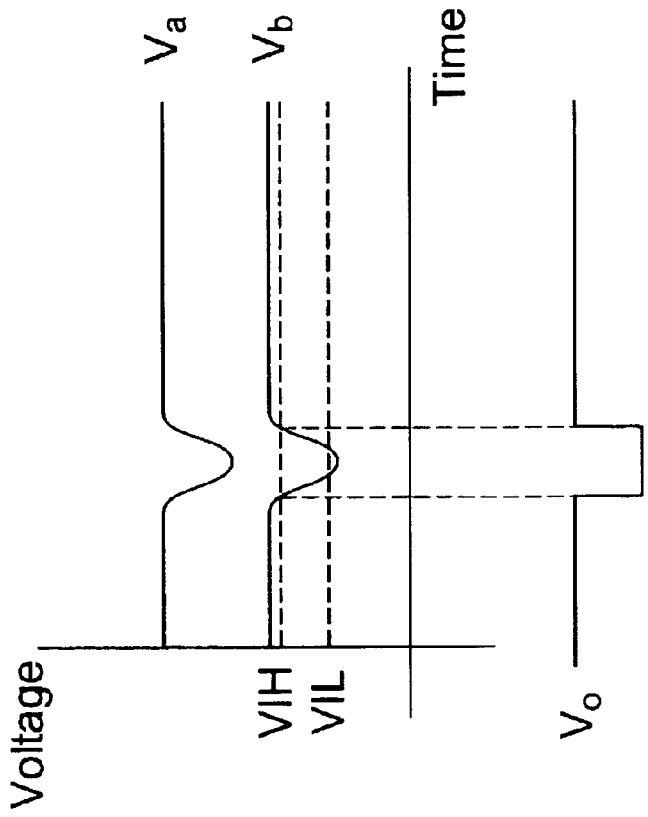
FIG. 3(c) is a truth table illustrating processing conditions of an AND gate serving as the voltage level detector of the present invention.
FIG. 3(d) is a timing waveform diagram showing the inputs and output of the AND gate serving as the voltage level detector of the present invention.

Please refer to FIG. 3(c) that is a truth table illustrating processing conditions of the AND gate 220, and further FIG.

3(d). It is found from the table that the output Vo of the AND gate 220 is logic "1" when both inputs Va and Vb are determined to be high levels, i.e. logic "1"s. On the other hand, the output Vo of the AND gate 220 is logic "0" when either one or both of the inputs Va and Vb is/are logic "0". In the meantime, the warning signal WS is asserted. FIG. 3(d) is a timing waveform diagram illustrating the inputs Va and Vb and the output Vo of the AND gate 220. During normal operation, the input voltage Va is greater than the index voltage Vb, and the index voltage Vb is greater than the upper threshold voltage VIH. If the input voltage Vcc from the power supply apparatus 20 and thus Va drops abruptly, the index voltage Vb might correspondingly drop below the upper threshold voltage VIH. Therefore, the inputs Vb will be determined to be logic "0" to indicate the unstable power situation, and the warning signal WS will be asserted. Alternatively, it can be designed that the unstable power situation is indicated only when Vb drops below the lower threshold voltage VIL. In such way, a user can easily determine whether the power from power supply apparatus 20 is in a stable state or not.

Furthermore, since there are the register 28 providing data to tune the index voltage Vb and the ripple counter 25 informing of the power-unstable times, a user can take measures to improve the voltage level detector. More specifically, the voltage level detector of the present invention is totally designed by digital logic circuitry, no large current is required to pass therethrough, thereby minimizing power consumption. Since the problems of high power consumption and high heat in the prior art can be prevented, the present voltage level detector with totally digital logic circuitry can be embedded into another IC chip, for example a core logic chip such as a south bridge chip or a north bridge ship and a system on chip (SOC), so as to reduce the manufacturing and testing cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage level detector for use between a power supply apparatus and a functional circuit, comprising:
   a power input terminal electrically connected to said power supply apparatus for receiving therefrom power of a first voltage;
   a voltage dividing circuit electrically connected to said power input terminal and adjustably dividing said first voltage into a second voltage having a level lower than that of said first voltage but greater than a threshold voltage; and
   a logic operation circuit coupled to said functional circuit, said power input terminal and said voltage dividing circuit, and logically operating voltages received from first and second input ends thereof to determine an output logic state,
   wherein said output logic state of said logic operation circuit changes when said second voltage level drops below said threshold voltage.

2. The voltage level detector according to claim 1 wherein said logic operation circuit includes an AND gate.

3. The voltage level detector according to claim 1 wherein said voltage dividing circuit comprises a controllable resistor for adjusting said second voltage.

4. The voltage level detector according to claim 1 further comprising a sample and hold circuit electrically connected to said logic operation circuit for outputting a warning signal when said second voltage level drops below said threshold voltage.

5. The voltage level detector according to claim 4 further comprising a refreshing circuit electrically connected to said sample and hold circuit for clearing an output of said sample and hold circuit.

6. The voltage level detector according to claim 1 further comprising a ripple counter electrically connected to and disposed downstream of said logic operation circuit, and counting incrementally whenever said second voltage level drops below said threshold voltage.

7. The voltage level detector according to claim 1 further comprising a multiplexer electrically connected to said voltage dividing circuit, a reference voltage input terminal and said logic operation circuit, and selecting one of said second voltage and a reference voltage to be outputted to said second input end of said logic operation circuit to be logically operated with said first voltage in response to a selection signal.

8. The voltage level detector according to claim 7 further comprising a compensation resistor electrically connected among said multiplexer, said logic operation circuit and ground.

9. The voltage level detector according to claim 1 further comprising a register electrically connected to said voltage dividing circuit for providing data to tune said second voltage.

10. The voltage level detector according to claim 1 further comprising a resistor electrically connected between said power supply apparatus and said logic operation circuit for adjusting said second voltage.

11. The voltage level detector according to claim 1 wherein said voltage level detector is integrated with said functional circuit.

12. The voltage level detector according to claim 1 wherein said threshold value is a minimal input voltage value defined as a high level by said logic operation circuit.

13. The voltage level detector according to claim 1 wherein said threshold value is a maximal input voltage value defined as a low level by said logic operation circuit.

14. A voltage level detector for use between a power supply apparatus and a functional circuit, comprising:
    a power input terminal electrically connected to said power supply apparatus for receiving therefrom power of a first voltage;
    a voltage dividing circuit electrically connected to said power input terminal for dividing said first voltage into a second voltage; and
    an AND gate integrated with said functional circuit and having a first and a second input ends thereof electrically connected to said power input terminal and said voltage dividing circuit, respectively, for receiving and operating said first and said second voltages according to a threshold value, thereby determining whether said power is in a stable state or not.

15. The voltage level detector according to claim 14 wherein said voltage dividing circuit comprises a variable resistor for adjusting said second voltage.

16. The voltage level detector according to claim 14 further comprising a sample and hold circuit electrically connected to said AND gate for outputting a warning signal to said functional circuit when an output of said AND gate is pulled low.

17. The voltage level detector according to claim 16 further comprising a refreshing circuit electrically connected to said sample and hold circuit for periodically clearing an output of said sample and hold circuit.

18. The voltage level detector according to claim 16 further comprising a ripple counter electrically connected to and disposed downstream of said logic operation circuit, and counting incrementally in response to said warning signal.

19. The voltage level detector according to claim 14 further comprising a multiplexer electrically connected to said voltage dividing circuit, a reference voltage input terminal and said logic operation circuit, and selecting one of said second voltage and a reference voltage to be outputted in response to a selection signal.

20. The voltage level detector according to claim 14 further comprising a register electrically connected to said voltage dividing circuit for providing data to tune said second voltage.

* * * * *